United States Patent [19]
Statham et al.

[11] Patent Number: 5,768,399
[45] Date of Patent: Jun. 16, 1998

[54] LOW DISTORTION AMPLIFIER

[75] Inventors: Kelly E. Statham, Cleveland Heights; Robert T. Green, III, Stow, both of Ohio

[73] Assignee: Audio Technica U.S., Inc., Stowe, Ohio

[21] Appl. No.: 775,569

[22] Filed: Dec. 31, 1996

Related U.S. Application Data

[63] Continuation of Ser. No. 513,011, Aug. 10, 1995, abandoned, which is a continuation-in-part of Ser. No. 29,756, Oct. 17, 1994, abandoned.

[51] Int. Cl.$^6$ .................................................. H03E 21/00
[52] U.S. Cl. ............................................ 381/420; 330/265
[58] Field of Search ................................. 330/262, 263, 330/265; 381/18, 24, 120

[56] References Cited

U.S. PATENT DOCUMENTS

| | | |
|---|---|---|
| 4,194,165 | 3/1980 | Skulski . |
| 4,370,623 | 1/1983 | Nagasawa . |
| 4,404,528 | 9/1983 | Yamaguchi ............................ 330/263 |
| 4,613,810 | 9/1986 | Jablonski et al. . |
| 4,933,645 | 6/1990 | Kasai . |
| 5,031,221 | 7/1991 | Yokoyama ............................ 381/96 |
| 5,070,308 | 12/1991 | Padi ............................ 330/263 |
| 5,179,352 | 1/1993 | Inohana . |
| 5,251,260 | 10/1993 | Gates ............................ 381/18 |
| 5,261,005 | 11/1993 | Masayuki ............................ 381/18 |
| 5,361,381 | 11/1994 | Short ............................ 381/24 |

OTHER PUBLICATIONS

Jung, Walter G., *Practical Audio Circuits Using IC Op Amps*, Third Edition, 1986, pp. 122–125.

Primary Examiner—Forester W. Isen
Attorney, Agent, or Firm—Welsh & Katz, Ltd.

[57] ABSTRACT

An audio surround-sound system includes a main enclosure, an audio decoder device to decode audio source signals supplied by an audio source device to provide decoded audio signals, and at least a first and second low distortion amplifier housed within the main enclosure to receive and amplify the decoded audio signals. Also included is at least a first and a second speaker element operatively coupled to the at least first and second amplifiers, respectively, to produce the audible signals, where the audible signals are received by the listener from a first and second direction. A local radio transmitter converts a portion of the decoded audio signals into radio modulated signals and transmits the radio modulated signals where a wireless receiver receives and converts the radio modulated signals into remote audio source signals. A third speaker element produces audible signals to be received by the listener from a third direction, where the third speaker element is operatively coupled to a third low distortion amplifier. The third low distortion amplifier receives and amplifies the remote audio source signals, where the third low distortion amplifier, the wireless receiver and the third speaker element are remotely located from the main enclosure. The audible signals received by the listener from the first, second, and third directions operatively surround the listener with the audible signals.

14 Claims, 4 Drawing Sheets

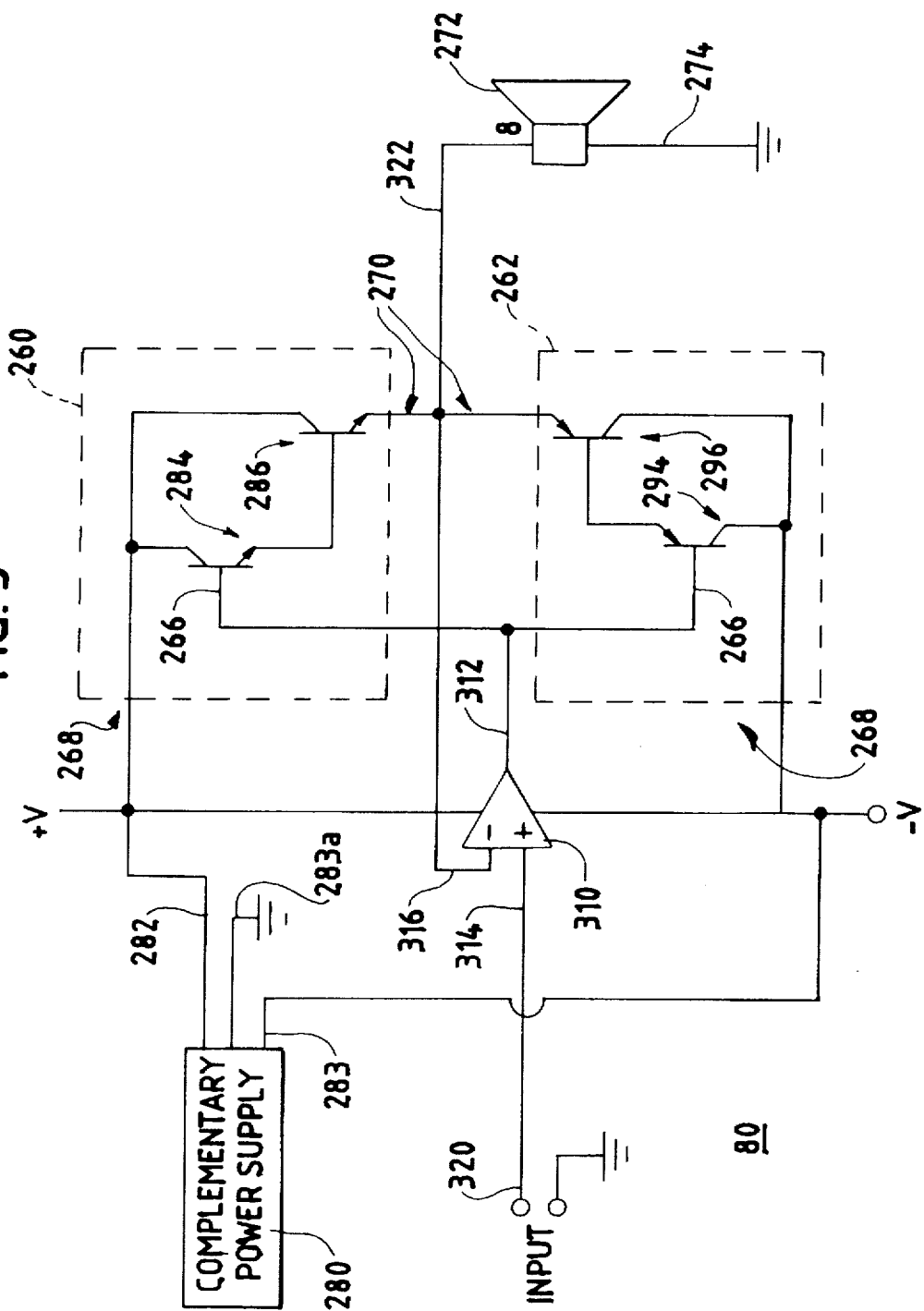

LOW DISTORTION AMPLIFIER

This is a continuation of application Ser. No. 08/513,011 filed on Aug. 10, 1995 now abandoned, which is a continuation-in-part of Ser. No. 29/029,756 filed on Oct. 17, 1994 now abandoned in the name of Jacquelynn Hebrock and Peter T. Sabin, and currently pending.

BACKGROUND OF THE INVENTION

The present invention relates generally to audio systems and more specifically to an audio system having multiple speaker elements to provide a listener with a surround-sound audible environment.

Stereo audio systems are well known in the art and have been in existence for many years. However, one significant disadvantage of stereo audio systems is that the audible environment does not appear realistic to the listener since only two speakers are used. Improper positioning of the speakers or improper channel balance can degrade system performance even further.

In an attempt to increase the listener's perception that he or she is within a concert hall or at a live performance, the concept of stereo had been previously expanded to provide four speakers. This concept was referred to as quadraphonic audio. However, quadraphonic audio systems fell into disfavor some years ago, due in part, to the cost of providing extra speakers and the increased cost associated with amplifiers needed to drive four channels. Additionally, unsightly wiring between the amplifier or receiver and the speakers is a disadvantage associated with stereo audio systems which is significantly increased when connecting four speakers to a quadraphonic amplifier. The user must hide or route four sets of speaker wires within a room or be resigned to exhibiting a "rats' nest" of tangled wires. Understandably, quadraphonic audio systems are not popular consumer products.

Users also desire to immerse themselves in an "entertainment experience" when viewing movies, when listening to music or when listening to any audio output associated with a wide variety of entertainment media devices. With the proliferation of video cassette recorders (VCRs), a large percentage of individuals have access to rental movies. By routing the audio output from a VCR or laser-disk player to an existing audio system, the user may experience audio fidelity greater than is possible from small inferior speakers provided in many televisions.

Connecting a VCR or a laser-disk player to an existing audio system, such as a stereo audio system, may be a difficult task for some users. Moreover, multiple speaker audio systems present difficulties when the user must interconnect all of the required cables between the various electronic components. Even when the user successfully connects a VCR or a laser-disk player to an existing audio system, the sound reproduced does not possess the realistic quality of a live concert where the listener is typically surrounded by sound from many directions. Additionally, the "presence" of the audio sound produced by known audio systems is often inferior to that of concert halls and live performances. This is due, in part, to the distance that the sound must travel in concert halls and other large listening areas and the echo effect created by such distances.

Amplifiers used in audio applications to drive speakers are generally transistorized class A-B amplifiers where the transistors are biased using biasing components, such as resistors. Biasing the transistors keeps them slightly "turned-on" or in a conducting state to overcome the voltage drop between the base and emitter (VBE) of the transistor. Such amplifiers are said to operate in class A-B. Such transistors conduct even when no input signal is applied.

In class B type amplifiers, the transistors only conduct when an input signal is present. To accomplish this, the transistors are not biased. However, this can result in signal distortion at the crossover point when the input signal diverges from a zero level. Signals below about 0.6 volts, approximately equal to the transistor base to emitter voltage drop (VBE), are lost since the transistor is in a "turned-off" or non-conducting condition and cannot reproduce the input signal. This results in signal distortion known as crossover distortion. Crossover distortion is unacceptable in audio applications, hence, class B audio amplifiers are not typically used. Class A-B amplifiers, instead, are used in most audio applications and are biased to reduce crossover distortion.

For many audio amplifier applications, class A-B amplifiers work well, such as in separate component amplifiers where size, weight and power consumption are of little significance. However, in applications where power consumption and heat dissipation are significant considerations, these drawbacks may become paramount.

A significant disadvantage of class A-B transistor amplifiers is that they are always slightly "conducting" thus, there is significant power dissipation, even when no input signal is present. Accordingly, such amplifiers generate heat even when no input signal is present. This is a significant disadvantage in audio amplifier systems since increased power dissipation necessitates use of larger and more costly power supplies. Additionally, if such amplifiers are incorporated into sealed or semi-sealed enclosures, ventilation concerns must be addressed. If the amplifier is not adequately ventilated, excessive heat can build up which may result in decreased component lifetime and destructive failure of the amplifier.

Class B amplifiers for audio applications reduce heat dissipation problems but suffer from the crossover distortion problem described above. A need exists for a class B audio amplifier that does not suffer from crossover distortion problems.

Accordingly, it is an object of the present invention to substantially overcome the above-described problems.

It is another object of the present invention to provide a surround-sound audio system that is self-contained and easily transportable.

It is a further object of the present invention to provide a surround-sound audio system having left, right and center speakers and also having a rear surround-sound speaker and a sub-woofer speaker.

It is also an object of the present invention to provide a surround-sound audio system having a remote surround-sound speaker that is wirelessly coupled using radio transmission in the 900 MHz band.

It is still an object of the present invention to provide a surround-sound audio system that easily and conveniently attaches to a VCR, a television, a laser-disk player, and the like.

It is yet another object of the present invention to provide a surround-sound audio system having low distortion amplifiers to drive individual speakers where the amplifiers are inexpensive to produce, generate little heat and are constructed using a minimum of components.

It is a further object of the present invention to provide a surround-sound audio system having a compact enclosure that houses substantially all of the electronics which drive the attached speakers and provides a recess to house all of the speakers when not in use.

It is still an object of the present invention to provide a surround-sound audio system where the speakers are automatically matched and balanced to produce an audible output level that is balanced with respect to volume, frequency response and sensitivity.

It is another object of the present invention to provide an audio amplifier that operates in class B.

It is a further object of the present invention to provide a class B audio amplifier that does not suffer from crossover distortion and consumes very little power and generates little heat.

It is also an object of the present invention to provide a class B audio amplifier having a minimal number of components that is economical to manufacture.

SUMMARY OF THE INVENTION

The disadvantages of known audio systems are substantially overcome with the present invention by providing a novel surround-sound audio system.

The audio surround-sound system includes a self contained enclosure housing electronics that drive three wire-attached speakers, one built-in speaker and one wireless remote speaker. The system easily attaches to any VCR, television, laser-disk player, CD-ROM player, satellite broadcast system, video game and the like providing two audio output channels. The system includes a left, right and center speaker and also includes a remote wireless rear surround-sound speaker and a sub-woofer speaker.

The rear surround-sound speaker significantly increases the realism and presence of the audio signal produced by essentially surrounding the listener in sound to rival the quality of sound heard in concert halls and at live performances. Additional realism in sound production is provided by the sub-woofer speaker disposed within a main enclosure which supplies low frequency and sub-sonic signals.

The system is extremely compact as the enclosure has a chamber which houses the left, right, center (attached speakers) and rear surround-sound speaker (non-attached speaker) when not in use. The enclosure also contains all of the electronic components needed to drive the attached speakers such that the user need not be concerned with interconnecting many various electronic components. The user need only remove the speakers from the enclosure top and place them at selected points around the room and connect the system to the VCR or other source audio device.

The rear surround-sound speaker is wireless and contains a radio receiver and an amplifier to receive surround-sound audio signals transmitted by radio waves from a transmitter disposed in the enclosure. Thus, no long and unsightly cables need be attached between the rear surround-sound speaker and the system.

More specifically, the audio surround-sound system of the present invention for providing audible signals to listener from three or more directions simultaneously, includes a main enclosure, an audio decoder device to decode audio source signals supplied by an audio source device to provide decoded audio signals, and at least a first and second low distortion amplifier housed within the main enclosure to receive and amplify the decoded audio signals.

Also included is at least a first and a second speaker element operatively coupled to the at least first and second amplifiers, respectively, to produce a portion of the audible signals, where the audible signals are received by the listener from a first and second direction. A local radio transmitter converts a portion of the decoded audio signals into radio modulated signals and transmits the radio modulated signals when a wireless receiver receives and converts the radio modulated signals into remote audio source signals.

The invention also includes is a third low distortion amplifier to receive and amplify the remote audio signals, where the third low distortion amplifier and the wireless receiver are remotely located from the main enclosure. A third speaker element produces the audible signals to be received by the listener from a third direction, where the third speaker element is operatively coupled to the third low distortion amplifier such that the audible signals received by the listener from the first, second, and third directions operatively surround the listener with the audible signals.

In another aspect of the present invention, the disadvantages of known audio amplifiers are substantially overcome by providing a novel low distortion amplifier that operates entirely in class B so that transistors do not conduct when an input signal is not present. This significantly reduces power consumption and heat dissipation. An amplifier having such low power consumption characteristics is essential for an audio system where the amplifier is enclosed within a structure having limited ventilation.

Additionally, crossover distortion and non-linear response of the speakers are substantially eliminated by feeding back an output of the transistors driving a load or speaker to the negative feedback terminal of an operational amplifier.

More specifically, the audio amplifier according to the present invention includes two complementary output devices each having a signal input terminal, a current input terminal and a current output terminal. The current output terminals of each complementary output device are directly connected to each other and are directly connected to an external load, where the external load has a current return path to ground. The current input terminals of each complementary output device are directly connected to an appropriate polarity of an external complementary power source.

Also included is an operational amplifier having an output terminal, a source input terminal, and a negative feedback input terminal. The output terminal of the operational amplifier is connected to the signal input terminals of each of the complementary output devices while the negative feedback input terminal is directly connected to a junction of the external load and the current output terminal of each complementary device such that non-linear reaction of the external load is reflected back to the operational amplifier to reduce signal distortion caused by the non-linear reaction.

The signal input terminal, the current input terminal and the current output terminal of each complementary output device are not connected to discrete resistive, capacitive or inductive elements such that when the source input terminal of the amplifier is not supplied with a source signal, the complementary devices draw no power and dissipate no heat.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings.

FIG. 3 is a schematic diagram of a specific embodiment of a low distortion amplifier according to the present invention.

DETAILED DESCRIPTION OF THE INVENTION

Figure 1A:
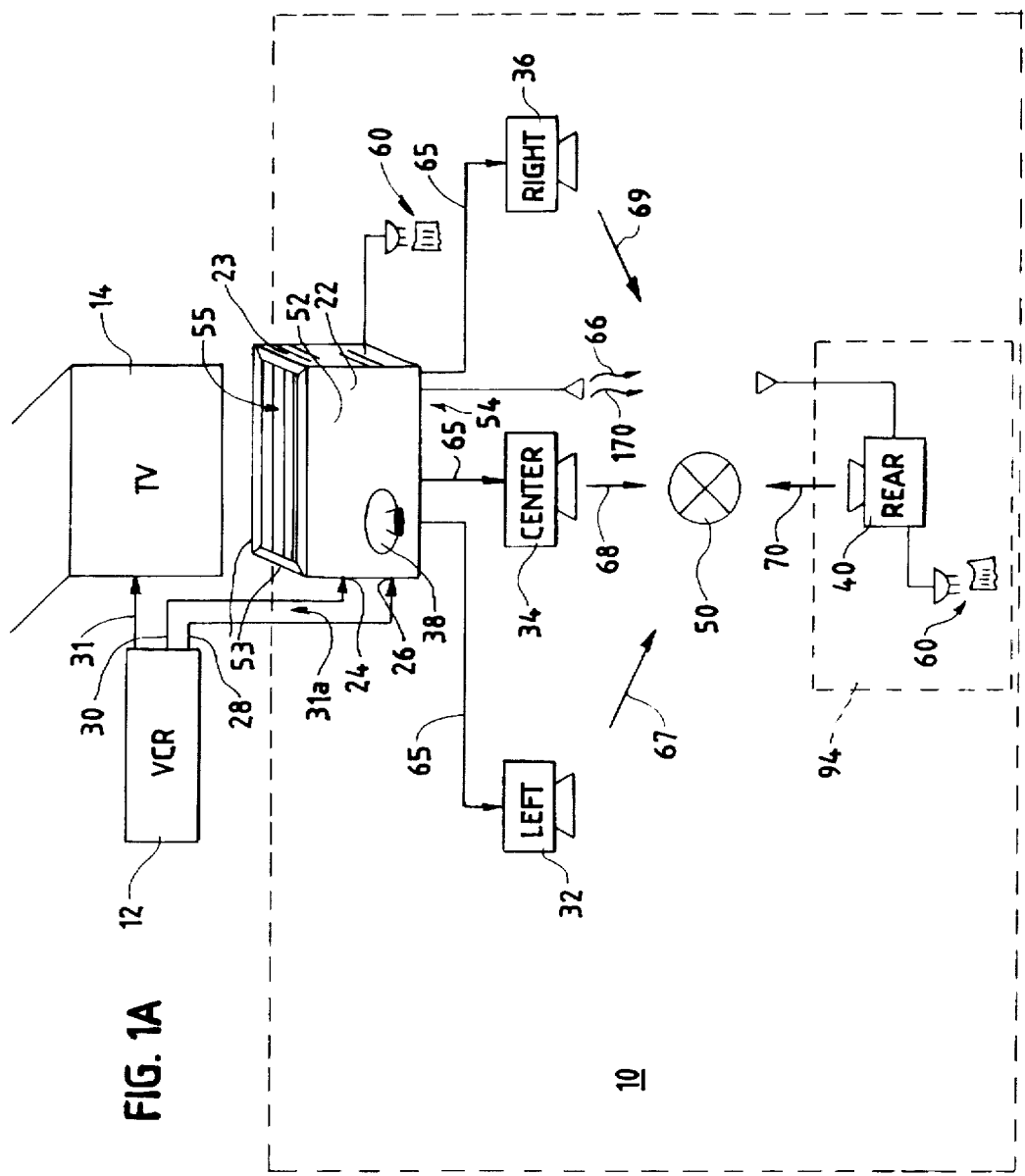
FIG. 1A is a partial pictorial and block diagram of a specific embodiment of the audio surround-sound system.

Referring now to FIG. 1A, an audio surround-sound system 10 is shown generally attached to external devices, such as to a VCR 12 and a television 14. The system 10 includes an enclosure 22 which houses the majority of the electronic components of the system. The enclosure or main housing 22 is preferably constructed from high-strength ABS plastic and includes reinforcing ribs 23 for increased structural integrity and for minimizing resonance vibration. The enclosure 22 includes two stereo inputs 24 and 26 for receiving audio input signals from left and right audio output channels 28 and 30 of the VCR 12 or other source audio device. For example, a video disk player, a television 14, a video game, a satellite broadcast system, a CD-ROM player or any other suitable device that supplies dual audio output signals may be used.

A video cable 31 may be connected between the VCR 12 and the television 14. Additionally, a universal cable 31a connecting the stereo inputs 24 and 26 to the left and right audio output channels 28 and 30 of the VCR 12 is included which is configured to connect to a variety of connector types, such as ¼ inch headphone connectors or RCA-type connectors. The user need not be concerned with adapters or converter plugs since the universal cable 31A includes all combinations of connector types to facilitate quick and convenient connection between the system 10 and the VCR 12.

A total of five loudspeakers or speaker elements are connected to the system 10 and include a left speaker 32, a center speaker 34, a right speaker 36, a sub-woofer speaker 38, and a rear surround-sound speaker 40. The left speaker 32, center speaker 34, right speaker 36 and rear surround-sound speaker 40 are referred to as "satellite speakers" and are removably separable from the enclosure 22. These satellite speakers are placed in strategic locations about the room to effectively "surround" a listener 50 with audible signals. Each satellite speaker 32, 34 and 36, except for the surround-sound speaker 40, contains a four inch midrange speaker (not shown) and a ¾ inch tweeter (not shown) for high-fidelity sound reproduction, as is known in the art. The sub-woofer speaker 38 is fixedly mounted within the enclosure 22 and provides extremely low frequency and sub-sonic audible output. The thickness of a forward wall 52 of the enclosure 22 is sufficient to house the sub-woofer speaker 38.

The enclosure 22 is box-like in shape and is formed from side walls 53, a bottom wall 54 and a slightly recessed or indented top surface 55. The recessed top surface 55 is configured to removeably receive a portion of the satellite speakers 32, 34, 36 and 40 during periods of non-use. The enclosure 22 is dimensioned so that the recessed top surface 55 partially receives and secures thereto the four satellite speakers 32, 34, 36 and 40 when the system 10 is not in use. The top surface 55 provides a "tongue and groove" arrangement where grooves disposed on the satellite speakers correspondingly mate with tongues disposed on the top surface 55 to aid in retaining the satellite speakers. Once the four satellite speakers 32, 34, 36 and 40 are secured to the top surface 55, the system 10 can be easily transported by the user.

Figure 1B:
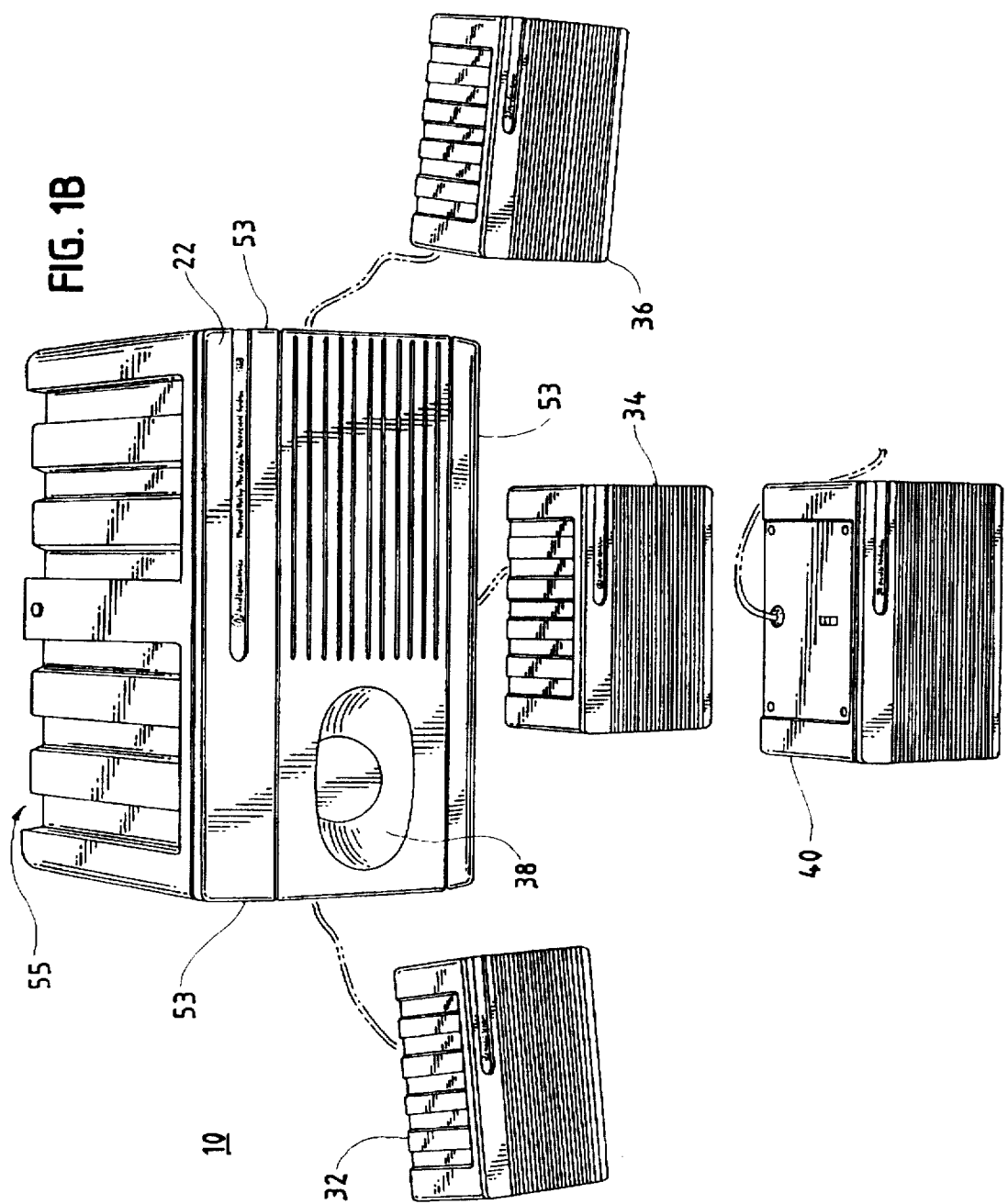
FIG. 1B is a pictorial view of the specific embodiment of the audio surround-sound system.

Referring now to FIGS. 1A and 1B, FIG. 1B illustrates the enclosure 22 and satellite speakers 32, 34, 36 and 40. In operation, to use the system 10, the four satellite speakers 32, 34, 36 and 40 are removed from the recessed top surface 55 and placed about the room such that the left speaker 32 is disposed to the left of the listener 50, the right speaker 36 is disposed to the right of the listener and the center speaker 34 is preferably disposed between the left and the right speakers. The enclosure 22 containing the fixedly mounted sub-woofer speaker 38 is generally placed forward of the listener 50 in a convenient location near the VCR 12 to facilitate connection to the VCR or other source audio device. The rear surround-sound speaker 40 is placed behind the listener 50 and is connected to an AC power source, such as a standard household wall outlet 60. Note that the rear surround-sound speaker 40 is not physically connected to the system 10 and need only be plugged into the standard wall outlet 60.

Next, the stereo inputs 24 and 26 are connected to the left and right audio output channels 28 and 30 of the VCR 12 or other source audio device by the universal audio cable 31a, and the system 10 is connected to the standard wall outlet 60 and power is applied. When the VCR 12 or other audio source device is activated, audio input received from the VCR is amplified by the system 10 and output from the system via speaker wires 65 to the left speaker 32, the center speaker 34 and the right speaker 36, respectively. The sub-woofer speaker 38 receives its input via direct wiring within the enclosure 22 while a surround sound radio signal 66 is remotely transmitted to the rear surround-sound speaker 40 via radio frequency transmission, as will be describe in greater detail hereinafter.

Thus, the listener 50 is provided with audible sound signals from at least four directions simultaneously to provide a surround-sound environment. The listener receives audible sound signals from the left speaker 32, the center speaker 34 and the right speaker 36, as shown by arrows 67, 68 and 69, respectively. The listener 50 also receives audible sound signals from the rear surround-sound speaker 40, as shown by arrow 70. However, the signals produced by the sub-woofer speaker 38 are not generally perceived by the listener 50 from a particular direction, rather, the low frequency audible signals and sub-sonic signals produced are essentially "felt" by the listener as a physical sensation which greatly increases the realism and presence of the audible presentation.

Note that the center speaker 34 and the sub-woofer speaker 38 are not critical and the system 10 may provide a surround-sound environment using only the left 32, right 36 and rear surround-sound 40 speakers, although in the preferred embodiment, the center speaker 34 and the sub-woofer speaker 38 are included. Alternatively, multiple rear surround-sound speakers 40 may be provided.

Figure 2:
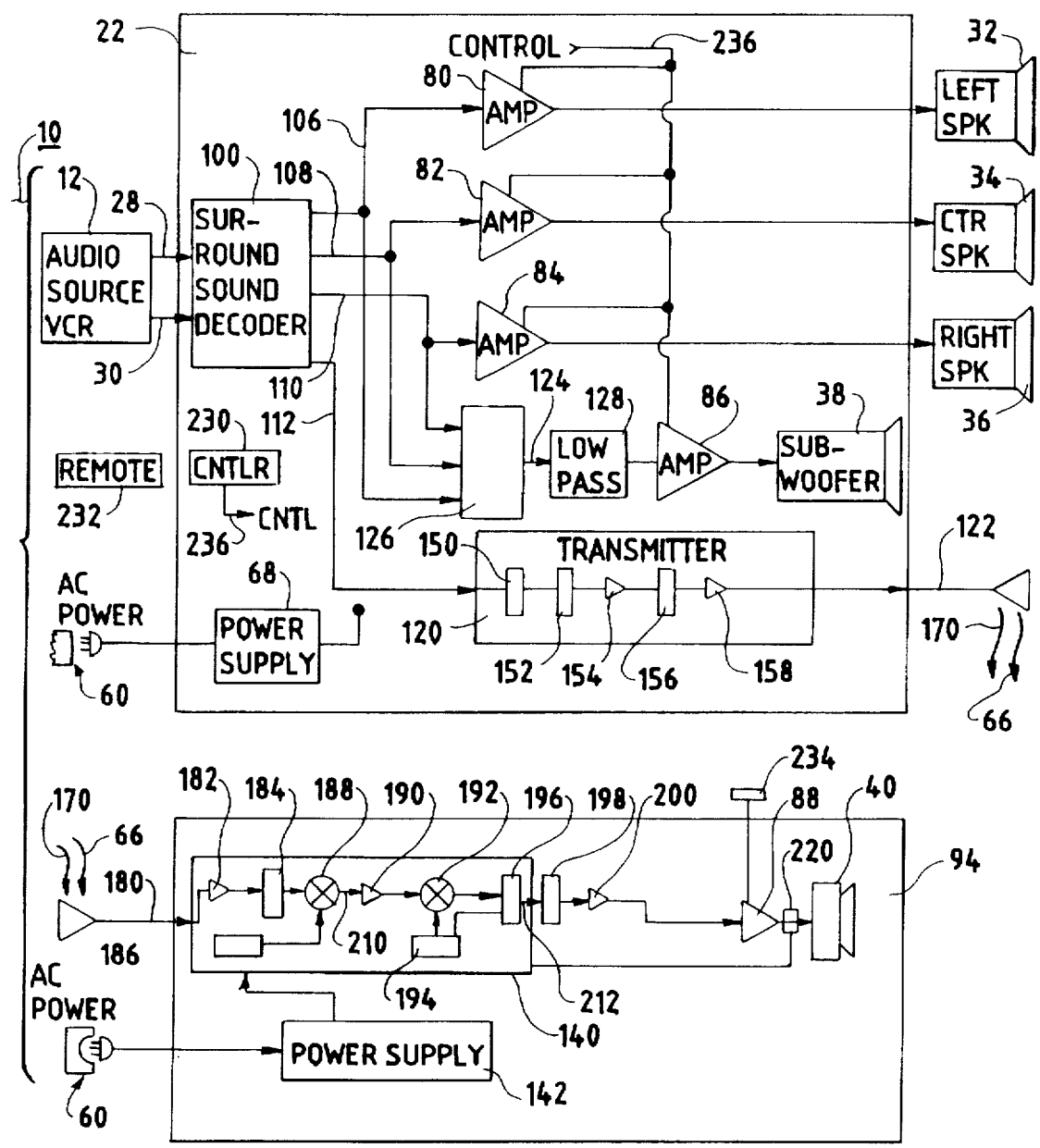
FIG. 2 is a block diagram of a specific embodiment of an audio surround-sound system shown in FIG. 1A.

Referring now to FIGS. 1A, 1B and 2, FIG. 2 is a block diagram of the system 10. Electronic components of the system 10 which drive all speakers, except the rear surround-sound speaker 40, are located on printed circuit boards (not shown) mounted within the enclosure 22 and are thus, hidden from view and are not accessible to the user. All electronic components receive power from a power supply 68 which may be a bridge rectifier type power supply, as is well known in the art. The power supply 68 is attached to the standard wall outlet 60 and may provide, for example, plus and minus 20 volts DC at 5 amperes, plus and minus 17 volts DC at 1 ampere, plus and minus 12 volts at 1 ampere, plus 8 volts DC at 1 ampere and plus 5 volts DC at 1 ampere for a total power output of about 140 Watts. However, any suitable power supply may be used.

The components mounted within the enclosure 22 include a left low distortion amplifier 80, a center low distortion amplifier 82, a right low distortion amplifier 84 and a sub-woofer low distortion amplifier 86 for driving the respective speakers 32–38. A rear surround-sound low distortion amplifier 88 for driving the rear surround-sound speaker 40 is disposed in a remote housing 94 containing the rear surround-sound speaker. The term "amplifier" will be used interchangeably with the phrase "low distortion amplifier" hereinafter.

Also mounted within the enclosure 22 is an audio decoder device 100 which receives the left and right audio source signals 28 and 30 supplied by the VCR 12 or other audio source device. The audio decoder device 100 may be, for example, a DOLBY Pro-Logic Surround Decoder Model No. NJM2177A, manufactured by New Japan Radio Company (J. R. C.) under a license from Dolby Labs, Inc., as is well known in the art. However, any suitable surround-sound audio decoder supplying the proper output signals may be used.

The audio decoder device 100 provides four output signals: a left decoded audio signal 106, a center decoded audio signal 108, a right decoded audio signal 110 and a surround decoded audio signal 112. The left 106, center 108 and right 110 decoded audio signals are received and amplified by the left 80, center 82 and right 84 amplifiers, respectively.

The surround decoded audio signal 112 is not directly connected to an amplifier, but rather, is routed to a local radio transmitter 120 which converts the signal into radio frequency signals and routes it to a transmitting antenna 122 for transmission to the rear surround-sound speaker 40, as will be described in greater detail hereinafter. Preferably, the audio decoder device 100 delays the surround decoded audio signal 112 in time by about 20 milliseconds prior to routing the signal to the local radio transmitter 120. However, any suitable audio decoder device 100 or surround-sound decoder device may be used which supplies audio signals delayed in time by about 15 to 60 milliseconds. The delayed audible signal produced by the rear surround-sound speaker 40, in part, accounts for the increased realism and presence of the surround-sound audio environment. Thus, the time delay in the audible signals produced by the surround-sound speaker 40 relative to the audible signal produced by the left 32, center 34 and right 36 speakers provide the listener 50 with a surround-sound audible environment.

The sub-woofer amplifier 86 does not receive its input directly from the audio decoder device 100. Instead, it receives input from an output 124 of a summing device 126 that has been routed through a low-pass filter 128. The output 124 of the summing device 126 is the summation of the signals provided by the left 106, center 108 and right 110 decoded audio signals. The summing device 126 for example, may be an operational amplifier arranged in a standard summing configuration, as is well known in the art. The operational amplifier for example, may be a model JRC4558 manufactured by J. R. C., or any suitable equivalent operational amplifier.

The audible signals produced by the sub-woofer speaker 38 are predominantly determined by the response characteristics of the low-pass filter 128 which significantly attenuates all frequencies over approximately 120 Hz, in combination with the frequency response of the sub-woofer speaker. The frequency response of the sub-woofer speaker 38 is in the range of about 40 Hz to 120 Hz while the frequency response of the left 32, center 34 and right 36 speakers is in the range of about 120 Hz 20 KHz. The frequency response of the surround-sound speaker 40 is in the range of about 100 Hz to 6,500 Hz.

The remote housing 94 containing the rear surround-sound speaker 40 also includes a wireless radio receiver 140 and a remote power supply 142 in addition to the surround-sound amplifier 88 and rear surround-sound speaker 40. The remote power supply 142 may be a bridge rectifier type power supply, similar to the power supply 68 contained within the main enclosure 22, as is well known in the art. Such a power supply 142 is connected to the standard wall outlet 60 and may provide, for example, plus and minus 17 volts DC at 2.5 amperes and plus 8 volts DC 1 ampere for a total power output of about 18 Watts. However, any suitable power supply may be used.

Thus, it can be seen that the remote housing 94 containing the rear surround-sound speaker 40 and associated electronics is self-contained and is not physically attached to the system 10. The listener 50 need only connect the remote housing 94 to the wall outlet 60 without the onerous task of "stringing" or routing cables to the main enclosure 22. Since the surround-sound speaker 40 is placed behind the listener, typically at a position relatively far from the VCR 12 or other source audio device, routing of a speaker wire to this speaker is difficult and cumbersome.

The local radio transmitter 120 and the radio receiver 140 operate in the 900 MHz radio frequency band extending from approximately 902 MHz to 928 MHz. The local radio transmitter 120 includes a radio signal modulator device 150, a tunable local oscillator 152 operating between about 915 MHz to 919 MHz, an RF (radio frequency) amplifier stage 154, a bandpass filter 156, an RF signal amplifier 158 and the transmitting antenna 122.

The local radio transmitter 120 converts the surround decoded audio signal 112 into the surround-sound radio frequency signal 66 for transmission in the 900 MHz band. The local radio transmitter 120 is a standard radio transmitter that may be implemented, for example, using a Model SMTXST-917 integrated radio transmitter package manufactured by Comtech Corporation, as is known in the art. The local radio transmitter 120 also transmits a 19 KHz pilot signal 170 in addition the surround-sound radio frequency signal 66 to activate and deactivate the rear surround-sound speaker 40, as will be described hereinafter.

The radio receiver 140 disposed in the remote housing 94 is a standard heterodyne radio receiver using dual-stage downconversion to downconvert the 900 MHz signal into audio signals. The radio receiver 140 is a standard radio receiver that may be implemented, for example, using a Model FMRXS-917 integrated radio receiver package manufactured by Comtech Corporation, as is known in the art. The radio receiver 140 includes a receiving antenna 180, an RF reception amplifier 182, a bandpass filter 184, a first tunable local oscillator 186 operating between about 1.000 GHz to 1.006 GHz, a first mixer 188, an intermediate amplifier (IF) 190, a second mixer 192, a second tunable local oscillator 194 operating between about 94 MHz to 98 MHz, an FM demodulator 196, a volume controller 198, and an audio frequency amplifier 200. The controller 198 and audio frequency amplifier 200 may be discrete components separate from the radio receiver 140 device.

The antenna 180 receives the 900 MHz signals which are then amplified by the RF reception amplifier 182 and processed by the bandpass filter 184. The signal is then fed to the first mixer 188 and mixed with the first tunable local oscillator 186 signal to produce first RF signals 210 in the FM broadcast band. The first RF signals 210 are amplified by the IF amplifier 190 and fed to the second mixer 192 and mixed with the second tunable local oscillator 194 signal. The output of the second mixer 192 is routed to the FM demodulator 196 where the input to the FM demodulator is a standard IF signal in the 10.7 MHz region. The FM demodulator 196 then converts the IF signal to an audio frequency signal 212.

The audio frequency signal 212 is then routed out of the radio receiver block 140 and fed to the controller 198. The signal is next amplified by the audio frequency amplifier 200 and is fed to the surround-sound low distortion amplifier 88 for power amplification and connection to the surround-sound speaker 40.

An electrical relay 220 is disposed between the surround-sound low distortion amplifier 88 and the speaker 40. The relay 220 is controlled by the radio receiver 140 in response to reception or non-reception of the 19 KHz pilot signal 170 transmitted by the transmitter 120. When power has not been applied to the system 10, the local radio transmitter 120 does not transmit the 19 KHz pilot signal 170. If the 19 KHz pilot signal is not received by the radio receiver 140, the radio receiver deactivates the relay 220, thus disconnecting any signal to the surround-sound speaker 40. This eliminates the possibility of the production of any spurious audible signals since the radio receiver 140 may receive extraneous radio signal when power is applied, even though the system 10 is turned-off and not transmitting. Such extraneous radio signals may be transmitted by CB radios and cellular telephones and the like. This allows the remote housing 94 to remain connected the wall outlet 60 during times when power is not applied to the system 10.

Alternatively, the rear surround-sound speaker 40 may not be limited to communication with the system 10 using 900 MHz transmission. For example, infra-red, laser, VHF or other form of electromagnetic radiation may be used as a communication medium.

The system 10 also includes a system controller 230 responsive to a remote control device 232. The remote control device 232 uses infra-red signals to communicate with the system controller 230. The system controller 230 for example, may be a Model PIC 16C54XT manufactured by Microchip Corporation, as is well known in the art. However, any suitable system controller 230 may be used. Commands sent to the system controller 230 by the remote control device 232 controls master power, volume, and mute. Each of the low distortion amplifiers 80, 82, 84 and 86 include a preamplifier portion (not shown) which further includes a voltage controlled amplifier which receives a gain control signal 236 from the system controller 230 which regulates gain and hence volume, as is well known in the art. Such a voltage controlled amplifier portion, for example, may be a Model SSM-2024 VCA manufactured by Analog Devices Corporation.

Note, that the master volume control from the remote control device 232 controls all speakers simultaneously. This is a significant feature of the system 10 since achieving an equal balance among a plurality of speakers is a difficult task for most users. The audio decoder device 100 produces balanced signals to each of the speakers 32–40 to achieve a perfect audible balance. Additionally, each speaker 32–40 is perfectly balanced relative to the other speakers with respect to frequency response, acoustic response and sensitivity to provide a substantially perfect surround-sound audible environment.

According to an alternate embodiment, a method for providing audible surround-sound signals to the listener 50 from the left 67, center 68, right 69 and rear 70 directions simultaneously, includes the steps of:

decoding the left and right audio source signals 28 and 30 provided by the VCR 12 to produce left 106, center 108, right 110 and surround 112 decoded audio signals and then amplifying the decoded audio signals using the left 80, center 82, right 84 and surround-sound 88 low distortion amplifiers where the amplifiers are configured to drive the left 32, the center 34, the right 36 and the surround-sound 40 speakers, respectively, to produce audible signals to be received by the listener 50 from the left direction 67, the center direction 68, the right direction 69 and the rear direction 70, simultaneously.

The steps also include delaying in time the surround decoded audio signal 112 by use of the audio decoding device 100 and converting the surround decoded audio signal into the radio modulated signals 66 and transmitting the radio modulated signals where they are wirelessly received by the radio receiver 140 and converted into the audio frequency signals 212.

The audio frequency signals 212 are then amplified by the surround-sound low distortion amplifier 88 to drive the surround-sound speaker 40 to produce audible signals. These audible signals are received by the listener 50 from the rear direction 70 where such signals are delayed in time relative to the audible signals received by the listener from the left 67, the center 68 and the right 69 directions to provide the listener with a surround-sound audible environment.

Preferably, the listener 50 also receives audible signals from the sub-woofer speaker 38, but such signals are not directionally perceived, but rather, are "felt" by the listener 50 to enhance the surround-sound audible environment.

Referring now to FIGS. 1 and 3, FIG. 3 is a schematic diagram of the low distortion amplifiers 80, 82, 84 and 88 which are all substantially identically, except for the sub-woofer amplifier 86 which operates at a higher power level relative to the other amplifiers, as will be described in greater detail hereinafter. The left 80, the center 82, the right 84 and the surround-sound 88 amplifier each provide about 20 Watts of power to drive the respective speakers while the sub-woofer amplifier 86 provides about 80 Watts of power to drive the sub-woofer speaker 38. For purposes of illustration only, the low distortion amplifiers 80, 82, 84, 86 and 88 will be referred to by the single reference numeral 80.

The low distortion amplifier 80 includes a first complementary output device 260 and a second complementary output device 262, shown in dashed lines. Each complementary output device 260 and 262 includes a signal input terminal 266, a current input terminal 268 and a current output terminal 270. The current output terminals 270 of each complementary output device 260 and 262 are directly connected to each other and are also directly connected to an external load 272. The external load 272 has a current return path to ground 274 and may be, for example, any of the speakers 32, 34, 36, 38 or 40. Such a load 272 has an impedance of about four ohms.

The current input terminals 268 of each complementary output device 260 and 262 are directly connected to an appropriate polarity of an external complementary power supply 280 providing plus 282 and minus 283 opposite polarity voltage outputs, for example, plus and minus 20 volts DC. The power supply 280 also includes a ground path 283a, as is known in the art. Each complementary output device 260 and 262 is configured as a Darlington complementary push-pull output stage, as is known in the art, and is used to provide high output power.

The first complementary output device 260 includes a first transistor 284, for example, a 2N3904 NPN-type transistor, and a second transistor 286, for example, a TIP41 NPN-type transistor where the emitter of the first transistor is connected to the base of the second transistor and the respective collectors are connected to each other and are further connected to the plus voltage supply 282. The first 284 and second 286 transistors forming the first complementary output device 260 are arranged in a standard Darlington configuration and any suitable transistors may be used.

The second complementary output device 262 includes a third transistor 294, for example, a 2N3906 PNP-type transistor, and a forth transistor 296, for example, a TIP42 PNP-type transistor where the emitter of the third transistor is connected to the base of the fourth transistor and the respective collectors are connected to each other and are further connected to the minus voltage supply 283. The third 294 and fourth 296 transistors forming the second complementary output device 262 are arranged in a standard Darlington configuration and any suitable transistors may be used.

An amplifier means, such as an operational amplifier 310, includes an output terminal 312, a source input terminal 314, and a negative feedback input terminal 316. The operational amplifier 310 may be, for example, an NE5532 high speed operational amplifier manufactured by Signetics Corporation. However, any suitable equivalent replacement operational amplifier may be used. The operational amplifier 310 is connected to the plus and minus voltages 282 and 283 to receive power.

The output terminal 312 of the operational amplifier 310 drives the signal input terminals 266 of each complementary output device 260 and 262 while the negative feedback input terminal 316 is directly connected to the junction of the external load 272 and the current output terminals 270 of each complementary device 260 and 262. An input source signal 320 is connected to the source input terminal 314 of the operational amplifier 310, and may be, for example, any of the decoded audio signals, such as the left 106, center 108, right 110 or surround 112 decoded audio signal which has been first routed through the preamplifier portion (not shown) described above. Note that the preamplifier portion amplifies the signals 106, 108, 110 and 112 to a level sufficient for power amplification by the low distortion amplifier 80. An output signal 322 driven by the current output terminals 270 drive the external load or speaker 272.

Note that two operational amplifiers 310 may be alternatively provided instead of a single operational amplifier where each operational amplifier may drive one of the complementary output devices 260 and 262. In this situation, the input source signal 320 would feed the source input terminal 314 of each operational amplifier 310 while the output terminal 312 of each operational amplifier would drive the signal input terminal 268 of each complimentary output device 260, 262, respectively.

Each complementary output device 260 and 262 has no connection to discrete resistive, capacitive or inductive elements. Accordingly, no biasing components exist. When the input source signal 320 is not present, all of the transistors 284, 286, 294 and 296 are in "cut-off", thus the complementary output devices 260 and 262 draw substantially no power and dissipate substantially no heat. Only the idle current of the operational amplifier 310 drawn from the power supply 280 is the source of power dissipation when no input source signal 320 is present.

This is an important feature in the present system 10 where the low distortion amplifier 80 is housed within the substantially sealed enclosure 22 that is provided with a minimum of ventilation. Heat dissipation is accomplished through passive radiation through the enclosure. For reasons of user safety and manufacturability, the enclosure 22 is not provided with vents which could allow unauthorized user access and could pose safety hazards. Additionally, the enclosure 22 is sealed to provide proper bass response of the sub-woofer speaker 38 enclosed therein.

The operational amplifier 310 is arranged in a voltage follower configuration and acts as a current amplifier having unity gain such that the voltage present on the output terminal 312 is substantially equal to the voltage present on the source input terminal 314, as is known in the art.

Prior art amplifiers 328 may include biasing components to eliminate the crossover distortion to "pull" the transistors 284 and 286 into slight conduction when in a quiescent state so that any change in the magnitude of the input source signal 320 relative to zero volts has an immediate effect on the transistors, since the signal need not overcome the 0.6 volt "turn-on" threshold of the transistors. Such constant conduction places the amplifier 328 in a class A-B mode instead of a pure class B mode. As described above, class A-B amplifiers render the audio system unsuitable for applications that are power and heat sensitive.

Use of negative feedback from the current output terminals 270 of each complementary output device 260 and 262 and the external load 272 to the negative feedback input terminal 316 eliminates crossover distortion which would normally be experienced by a class B amplifier using no feedback. Since the operational amplifier 310 is arranged in a unity gain configuration, the operational amplifier forces the output signal 322 to "look like" the input source signal 320. Thus, any difference between the output signal 322 and the input source signal 320 is immediately corrected by the operational amplifier 310.

Any non-linear reaction of the external load 272, is reflected back to the negative feedback input terminal 316 of the operational amplifier 310 to eliminate the signal distortion. Thus, crossover distortion and non-linear load reaction are virtually eliminated.

The low distortion amplifier 80 according to the illustrated embodiment is arranged in a pure class B configuration to reduce power consumption and heat dissipation. Power dissipation is minimized since the transistors 284, 286, 296 and 294 are not coupled to any biasing components and are "cut-off" when no input source signal 320 is present and thus, do not conduct. Such a configuration uses no biasing components such that only five components are used in its construction. Only four transistors 284, 286, 294, and 296 and a single operational amplifier 310 are needed to construct the amplifier 80. The amplifier 80 is efficient and economical to produce and delivers about twenty Watts of power into a four ohm load with a level of total harmonic distortion of about 0.5 percent.

However, output power of the amplifier can be increased by increasing the output voltage swing of the complementary power supply 280 and observing the maximum voltage specifications of the operational amplifier 310. Alternatively, the power supplied to the load 272 may be essentially quadrupled by using two low distortion amplifiers 80 in a bridge configuration where one amplifier drives the first terminal 322 of the load and the other amplifier drives the second terminal 274 of the load.

This is the case with the sub-woofer low distortion amplifier 86. The input source signal 320 is first fed to a buffer prior to being routed into the operational amplifier 310. However, the input buffer to one of the amplifiers inverts the input signal, thus each amplifier amplifies the signal in opposite directions such that when the signal is applied to the sub-woofer speaker 38, a signal of twice the normal magnitude is seen across the terminals 322 and 274 of the speaker.

A specific embodiment of an audio surround-sound system according to the present invention has been described for the purpose of illustrating the manner in which the invention may be made and used. It should be understood that implementation of other variations and modifications of the invention and its various aspects will be apparent to those skilled in the art, and that the invention is not limited by these specific embodiments described. It is therefore contemplated to cover by the present invention any and all modifications, variations, or equivalents that fall within the true spirit and scope of the basic underlying principles disclosed and claimed herein.

What is claimed is:

1. A low distortion amplifier comprising:

a first and a second complementary output device each having a signal input terminal, a current input terminal and a current output terminal;

an external complementary power source having a positive output terminal and a negative output terminal;

the current output terminals of each complementary output device directly connected to each other and directly connected to an external load, the external load having a current return path to ground;

the current input terminals of the first complementary output device directly connected to at least one of the positive output terminal and the negative terminal, the current input terminal of the second complementary device directly connected to the other of the positive output terminal and the negative output terminal;

an amplifier device having an output terminal, a source input terminal, and a feedback input terminal;

the output terminal of the amplifier device directly connected to the signal input terminals of each complementary output device;

the feedback input terminal directly connected to a junction of the external load and the current output terminal of each complementary device such that non-linear reaction of the external load is reflected back to the amplifier device to substantially eliminate signal distortion caused by the non-linear reaction; and the complementary devices drawing substantially no power and dissipating substantially no heat when the source input terminal of the amplifier device is not supplied with a source input signal.

2. The low distortion amplifier according to claim 1 wherein the signal input terminal, the current input terminal, and the current output terminal of each complementary output device have no connection to lumped resistive, capacitive, or inductive elements such that when the source input terminal of the amplifier device is not supplied with the source input signal, the complementary devices draw substantially no power and dissipate substantially no heat.

3. The low distortion amplifier according to claim 1 wherein each complementary output device is configured in a Darlington pair configuration.

4. The low distortion amplifier according to claim 1 wherein the low distortion amplifier operates in a non-biased class B mode.

5. The low distortion amplifier according to claim 1 wherein the amplifier device is a single operational amplifier.

6. The low distortion amplifier according to claim 5 wherein the single operational amplifier is arranged in a voltage follower configuration.

7. The low distortion amplifier according to claim 1 wherein the elimination of the signal distortion permits the low distortion amplifier to have a level of total harmonic distortion of less than about 0.5 per cent.

8. The low distortion amplifier according to claim 1 wherein the external load is a speaker element where non-linear reaction of the speaker element is substantially eliminated by feeding back the current output terminal signal driving the speaker element, to the negative feedback input terminal of the amplifier device.

9. A low distortion amplifier comprising:

a first and a second complementary output device, each having a signal input terminal, a current input terminal and a current output terminal;

an external complementary power source having a positive output terminal and a negative output terminal;

the current output terminals of each complementary output device directly connected to each other and directly connected to an external load, the external load having a current return path to ground;

the current input terminals of the first complementary output device directly connected to at least one of the positive output terminal and the negative terminal, the current input terminal of the second complementary device directly connected to the other of the positive output terminal and the negative output terminal;

a single operational amplifier having an output terminal, a source input terminal, and a negative feedback input terminal;

the output terminal of the single operational amplifier directly connected to the signal input terminals of each complementary output device;

the negative feedback input terminal directly connected to a junction of the external load and the current output terminal of each complementary device, such that non-linear reaction of the external load is reflected back to the single operational amplifier to substantially eliminate signal distortion caused by the non-linear reaction; and the signal input terminal, the current input terminal, and the current output terminal of each complementary output device having no connection to lumped resistive, capacitive, or inductive elements such that when the source input terminal of the single operational amplifier is not supplied with a source input signal, the complementary devices draws substantially no power dissipates substantially no heat.

10. The low distortion amplifier according to claim 9 wherein each complementary output device is configured in a Darlington pair configuration.

11. The low distortion amplifier according to claim 9 wherein the low distortion amplifier operates in a non-biased class B mode.

12. The low distortion amplifier according to claim 9 wherein the single operational amplifier is arranged in a voltage follower configuration.

13. The low distortion amplifier according to claim 9 wherein the low distortion amplifier has a level of total harmonic distortion of less than about 0.5 per cent.

14. The low distortion amplifier according to claim 9 wherein the external load is a speaker element where non-linear reaction of the speaker element is substantially reduced by feeding back the current output terminal signal driving the speaker element, to the negative feedback input terminal of the single operational amplifier.

* * * * *